United States Patent
Oudard (10) Patent No.: US 9,242,893 B2
(45) Date of Patent: Jan. 26, 2016

(54) ANTI REFLECTIVE COATING FOR PHOTOVOLTAIC GLASS PANEL

(71) Applicant: AGC FLAT GLASS NORTH AMERICA, INC., Kingsport, TN (US)

(72) Inventor: Jean-Francois Oudard, Kingsport, TN (US)

(73) Assignee: AGC FLAT GLASS NORTH AMERICA, INC., Kingsport, TN (US)

( * ) Notice: Subject to any disclaimer, the term of this patent is extended or adjusted under 35 U.S.C. 154(b) by 0 days.

(21) Appl. No.: 14/318,050

(22) Filed: Jun. 27, 2014

(65) Prior Publication Data
US 2015/0104568 A1    Apr. 16, 2015

Related U.S. Application Data

(63) Continuation of application No. 12/045,451, filed on Mar. 10, 2008, now abandoned.

(60) Provisional application No. 60/894,001, filed on Mar. 9, 2007.

(51) Int. Cl.
| | |
|---|---|
| G02B 1/11 | (2015.01) |
| C03C 17/25 | (2006.01) |
| G02B 1/113 | (2015.01) |
| H01L 31/0216 | (2014.01) |
| C03C 23/00 | (2006.01) |
| H01L 31/18 | (2006.01) |

(Continued)

(52) U.S. Cl.
CPC ............... *C03C 17/25* (2013.01); *C03C 23/007* (2013.01); *C03C 23/0085* (2013.01); *G02B 1/113* (2013.01); *H01L 31/02168* (2013.01); *H01L 31/18* (2013.01); *B05D 3/0254* (2013.01); *B05D 7/04* (2013.01); *B05D 2203/35* (2013.01); *C03C 2217/213* (2013.01); *C03C 2217/732* (2013.01); *C03C 2218/112* (2013.01); *C03C 2218/113* (2013.01); *C03C 2218/32* (2013.01); *G02B 2207/107* (2013.01); *Y02E 10/50* (2013.01)

(58) Field of Classification Search
CPC .......................................................... G02B 1/11
USPC ................................................................. 427/162
See application file for complete search history.

(56) References Cited

U.S. PATENT DOCUMENTS

| | | | |
|---|---|---|---|
| 6,177,131 | B1 | 1/2001 | Glaubitt et al. |
| 6,787,191 | B2 | 9/2004 | Hanahata et al. |

(Continued)

FOREIGN PATENT DOCUMENTS

| | | |
|---|---|---|
| EP | 1 329 433 | 7/2003 |
| JP | 03-199043 | 8/1991 |

OTHER PUBLICATIONS

U.S. Appl. No. 12/044,162, filed Mar. 7, 2008, Oudard.

(Continued)

*Primary Examiner* — Elizabeth Burkhart
(74) *Attorney, Agent, or Firm* — Oblon, McClelland, Maier & Neustadt, L.L.P.

(57) ABSTRACT

A method of making an anti-reflective film comprises preparing a liquid composition with specific amounts of tetraethyl orthosilicate, polyethylene glycol, HCl, ethanol and at least one alcohol having a higher boiling point than ethanol and miscibility with both ethanol and water; applying the liquid composition onto a surface of a substrate to form a liquid film; evaporating the ethanol and the at least one alcohol from the liquid film to form a solid film; and heating the solid film to form a silica film.

17 Claims, 4 Drawing Sheets

(51) Int. Cl.
*B05D 3/02* (2006.01)
*B05D 7/04* (2006.01)

(56) References Cited

U.S. PATENT DOCUMENTS 7,128,944 B2 10/2006 Becker et al.
2002/0173168 A1 11/2002 Ramos et al.
2004/0028918 A1 2/2004 Becker et al.

OTHER PUBLICATIONS

Abdelmalek et al., Optical fiber sensors sensitized by phenyl-modified porous silica prepared by sol-gel, Sensors and Actuators, B 56 (1999), pp. 234-242.
English translation of JP 03-199043; pp. 1-8.

ANTI REFLECTIVE COATING FOR PHOTOVOLTAIC GLASS PANEL

This application is a continuation of U.S. application Ser. No. 12/045,451, filed on Mar. 10, 2008 and claims benefit of U.S. Provisional Application No. 60/894,001, filed Mar. 9, 2007, which is hereby incorporated by reference in its entirety into the present application.

BACKGROUND OF THE INVENTION

1. Field of the Invention

The present invention relates to an anti-reflective coating. In particular, the present invention relates to an anti-reflective coating that can be used to increase the light transmission of glass used in the manufacture of solar modules, and to a method of making the anti-reflective coating.

2. Discussion of the Background

All United States Patents and Application Publications referred to herein are incorporated by reference in their entireties. In the case of conflict, the present specification, including definitions, will control.

Solar modules have been developed that convert light into electricity. These modules typically include an outer layer of glass. The difference in the index of refraction between the glass and air can lead to an undesirable partial reflection of light from the glass that reduces the amount of incident light that can be converted into electricity by the module.

Some success at reducing the reflection has been achieved by forming low index of refraction coatings of silica on the glass. U.S. Pat. No. 7,128,944 discloses low index silica coatings formed by coating the glass with an aqueous coating solution and a surfactant mixture, the aqueous coating solution having a pH of 3 to 8, containing 0.5 wt. % to 5.0 wt. % $[SiO_x(OH)_y]_n$ having a particle size of 10 nm to 60 nm, and a surfactant mixture; drying the coated glass; thermal toughening at temperatures of at least 600° C.; and thermal tempering of the coated glass by a forced air flow.

Other low index silica coatings have been formed by dipping a glass substrate in a mixture of tetraethyl orthosilicate and ethanol to form a liquid film on the glass, or by spraying on the glass a mixture of tetraethyl orthosilicate and ethanol to form a liquid film; evaporating the ethanol from the liquid film to form a film residue; and then heating the film residue to convert the tetraethyl orthosilicate into silica. Including polyethylene glycol in the liquid films has been found to create pores in the silica films during the heating that further lower the index of refraction of the silica and increases light transmission.

However, silica coatings formed using liquid films containing tetraethyl orthosilicate, polyethylene glycol and ethanol have not shown a consistent improvement in transmission. Accordingly, there is a need in the art for anti-reflection films that achieve improved properties with consistency and methods of preparing such films.

SUMMARY OF THE INVENTION

The present invention provides a method of making an anti-reflective film that can achieve anti-reflective properties with greater consistency than those currently known in the art. In particular, the present invention provides methods that allow for fast and consistent production of coatings that increase the light transmission through a substrate. For purposes herein, light transmission is taken to mean the ratio of the amount of photons passing through a given substrate to the amount of photons incident upon the given substrate.

Furthermore, the present invention provides a method for making a coating that improves "anti-reflective coating efficiency". For purposes herein, anti-reflective coating efficiency is taken to mean the increase in light transmission provided by a coating film on a given substrate compared to an uncoated given substrate.

Accordingly, the invention provides a method of preparing a coating comprising Si on a substrate comprising: (i) preparing a composition comprising a compound comprising Si and O, a polymeric glycol, a strong acid, at least a first alcohol, at least a second alcohol and water; (ii) applying the composition onto a surface of a substrate to form a film; (iii) evaporating the alcohols from the film; and (iv) heating the film.

Methods in accordance with the present invention utilize a series of chemical moieties which, when applied to at least one surface of a substrate and heated, provide the inventive features described herein. The chemical moieties are preferably compounds that comprise both Si and O, polymeric glycols, strong acids and alcohols. Aqueous solutions of these compounds, when applied to at least one surface of a substrate, allow for the production of a thin film coating that increases the light transmission through a substrate as well as the anti-reflective coating efficiency.

One aspect of the present invention is found to be driven by the ratio of polymeric glycol to a compound comprising Si and O. Another aspect of the present invention is found to be driven by the evaporation rates of the solvents from the starting composition. When the solvent comprises more than one alcohol, the evaporation rate of the alcohols may be controlled in such a way as to improve the application process.

It has been found that when the solvent comprises more than one alcohol, wherein one alcohol has a higher boiling point than the other, a reduction in undesirable evaporation of the solvent during application to at least one surface of a substrate is observed. Such undesirable evaporation can increase costs for both materials and cleanup and can also produce uneven liquid films that do not adequately wet the substrate. Having more than one alcohol present in the starting composition enhances the anti-reflective coating efficiency.

BRIEF DESCRIPTION OF THE DRAWINGS

The preferred embodiments of the invention will be described in detail, with reference to the following figures, where.

DETAILED DESCRIPTION OF PREFERRED EMBODIMENTS

The invention provides a method of preparing a porous silica coating on a substrate comprising: (i) preparing a composition comprising a compound comprising Si and O, a polymeric glycol, a strong acid, at least a first alcohol, at least a second alcohol and water; (ii) applying the composition onto a surface of a substrate to form a film; (iii) evaporating the alcohols from the film; and (iv) heating the film.

By choosing the proper ratio of the compounds of the starting composition, it is possible to create on at least a surface of a glass substrate, a coating with a lower refractive index than the glass. For purposes herein, the refractive index is a measure for how much the speed of light is reduced inside a given substrate as compared to air.

The present invention provides a method of making an anti-reflective film, the method may comprise preparing a liquid composition comprising 0.1 to 15 volume % of a compound comprising Si and 0, 0.1 to 80 g (preferably 0.1 to 25 g, more preferably 0.1 to 20.0 g) of a polymeric glycol per liter of the liquid composition, 0.1 to 20.0 g of a strong acid per liter of the liquid composition, 0.1 to 80 volume % (preferably 0.1 to 30 volume %, or 0.1 to 20 volume %, or 0.1 to 15 volume %) of at least one alcohol having a higher boiling point than at least one other alcohol contained in the starting composition, and a balance of the at least one other alcohol; applying the liquid starting composition onto a surface of a substrate to form a liquid film; evaporating at least the alcohols from the liquid film to form a solid film; and heating the solid film to convert the compound comprising Si and O into a silica film.

Figure 1:
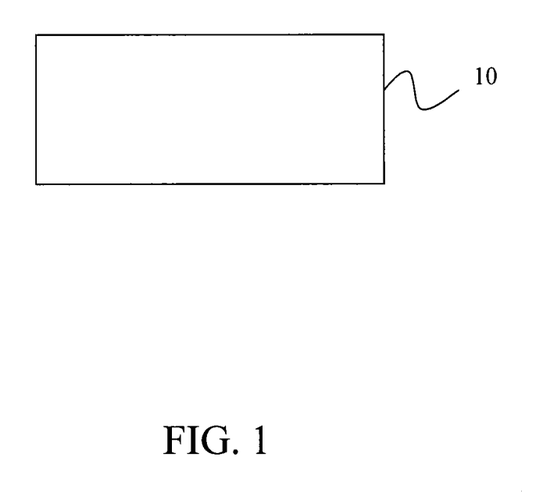
FIG. 1 shows a glass substrate.
Figure 2:
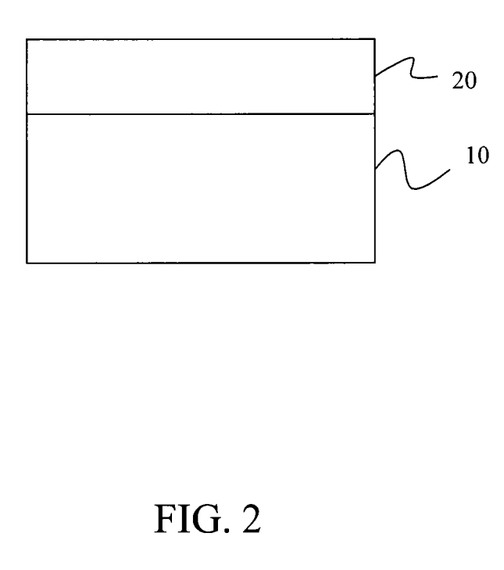
FIG. 2 shows a liquid film on a glass substrate
Figure 3:
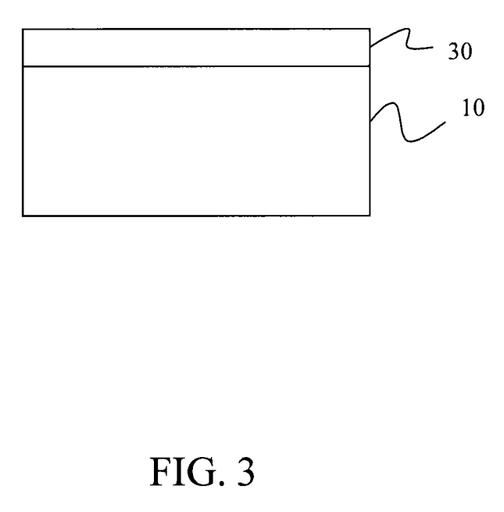
FIG. 3 shows a solid film on a glass substrate.
Figure 4:
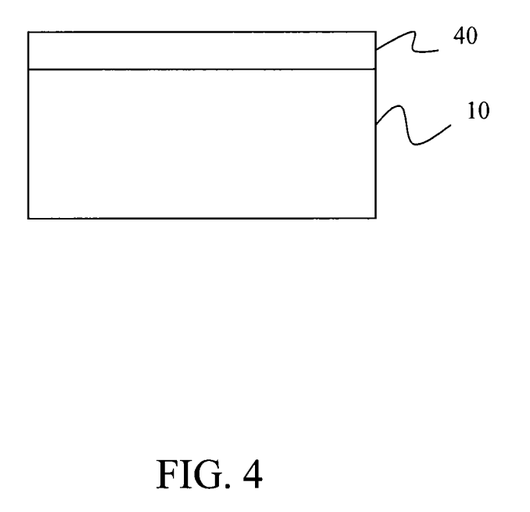
FIG. 4 shows a silica film on a glass substrate.

An embodiment of the method of the present invention is illustrated in FIGS. 1-4. FIG. 1 shows a glass substrate 10. FIG. 2 shows applied to the glass substrate 10 a liquid film 20 containing a compound comprising Si and O, a polymeric glycol, a strong acid and at least two alcohols. FIG. 3 shows on the glass substrate 10 a solid film 30 formed by evaporating from the liquid film 20 the at least two alcohols. FIG. 4 shows on the glass substrate 10 a silica film 40 formed by heating the solid film 30.

The following non-limiting list of compounds are representative of the moieties that may be used in carrying out the methods of the present invention. Compounds comprising Si and O may be silicates, silanols, siloxanes or silanes. Preferred compounds comprising Si and O are silicates. Most preferred compounds comprising Si and O are alkyl-orthosilicates, such as tetraethyl orthosilicate. Polymeric glycols may be of the polyalkyl, polyalkene or polyalkylene type. Preferred polymeric glycols are polyethylene, polypropylene and polybutylene glycols. The most preferred polymeric glycol is polyethylene glycol. Alcohols may be monohydric and polyols may be dihydric, trihydric, or polyhydric. Preferred alcohols are those of $C_1$-$C_8$ alkyl type, e.g, n-ethanol, n-propanol, n-butanol and n-pentanol. A most preferred alcohol is ethanol. Strong acids may be nitric acid, sulfuric acid, hydrochloric acid and hydrobromic acid. Preferred strong acids are hydrochloric and nitric acids.

The liquid composition is applied onto at least one surface of a substrate that is preferably transparent to visible light. The substrate can have one or two smooth surfaces. The surface can also have one or two patterned surfaces. The substrate is preferable a plastic or a ceramic, such as glass. More preferably, the substrate is glass. Most preferable, the substrate is a photovoltaic glass panel. The liquid composition may be applied to the surface of the substrate by spraying, dipping, brushing, spinning, or any other coating application method known to those of skill in the art. Preferably, the liquid composition is sprayed, brushed or spun onto the substrate. Most preferably, the liquid composition is sprayed.

In embodiments, when the liquid composition is applied onto the substrate, the liquid composition and the substrate may be at room temperature and the substrate is at atmospheric pressure. In embodiments, when the liquid composition to applied onto the substrate, the liquid composition and the substrate are at a temperature of 50° C. or above.

The liquid composition applied to the surface of the substrate forms a liquid film. The solvents, i.e., alcohols, evaporate, leaving a solid film comprising a compound comprising Si and O, a polymeric glycol and a strong acid. When the solid film is heated, the strong acid catalyzes the conversion of the compound comprising Si and O into silica, $SiO_2$. Preferably, the solid film is heated to a temperature in a range of from 500 to 800° C., more preferably from 650° C. to 750° C., for a period of time in a range of from 0.5 to 5 minutes, preferably 1 to 3 minutes. During the heating step, the polymeric glycol is pyrolized, or burned away, leaving a porous silica film. Increasing the porosity of the silica reduces the index of refraction of the silica, leading to improved light transmission through a substrate.

The composition of the method of the present invention may also comprise an alcohol having a higher boiling point than the alcohol already in the starting composition. Preferably, the alcohol having a higher boiling point than the already included alcohol is monohydric. More preferably, the alcohol having a higher boiling point may be propanol, butanol or pentanol. Furthermore, the alcohol having a higher boiling point must have miscibility with both the other alcohol and water.

In preferred embodiments, the liquid composition can be prepared by mixing together 0.1 to 10 volume % of a compound comprising Si and O, 0.1 to 15.0 g of a polymeric glycol per liter of the liquid composition, 0.1 to 10.0 g of a strong acid per liter of the liquid composition, 0.1 to 25 volume % of at least one alcohol having a higher boiling point than at least one other alcohol contained in the starting composition, and a balance of the at least one other alcohol.

In other preferred embodiments, the liquid composition may comprise 0.1 to 10 volume % (e.g., 0.1 to 5 volume %) of a compound comprising Si and O, preferably tetraethyl orthosilicate, 0.1 to 20 volume % (e.g., 0.1 to 5 volume %) of a solution of 30 g polymeric glycol, preferably polyethylene glycol, in 100 ml water, 0.1 to 2 volume % of a solution of 37 weight % strong acid, preferably hydrochloric acid, in water, 0.1 to 80 volume % (e.g., 0.1 to 20 volume %) of at least one alcohol, preferably n-butanol, having a higher boiling point than at least one other alcohol, contained in the starting composition, and a balance of at least one other alcohol, preferably ethanol. The polymeric glycol can have a weight average molecular weight (Mw) in a range of from 4000 to 16000, with a preferable molecular weight of 6000 to 12000.

During the mixing, the ratio of the volume % of the solution of polymeric glycol in 100 ml water to the volume % of the solution containing a compound comprising Si and O can be in a range of from 0.02 to 50. To improve the anti-reflective coating efficiency, the ratio of the volume % of the solution of polymeric glycol in 100 ml water to the volume % of the solution containing a compound comprising Si and O can be at least 0.5, preferably at least 1; more preferably at least 2.

The alcohol having a higher boiling point than at least the other alcohol and miscibility with water can have one or more hydroxyl groups. Thus, the alcohol having a higher boiling point can be monohydric, dihydric, trihydric, or polyhydric. Preferably, when the first alcohol is ethanol, the alcohol having a higher boiling point is monohydric. In embodiments, the alcohol having a higher boiling point than ethanol can be propanol, butanol or pentanol. Preferably, the alcohol having a higher boiling point than ethanol is butanol, most preferably, n-butanol.

The alcohol having a higher boiling point than ethanol reduces undesirable evaporation of solvents from droplets during application, which can increase costs for both materials and cleanup and which can produce uneven liquid films that do not adequately wet the substrate. The alcohol having a higher boiling point also reduces the evaporation rate of the liquid film, which enhances anti-reflective coating efficiency.

Evaporation of the alcohols from the composition applied to a substrate can take 60 seconds or more.

The liquid composition is applied onto at least one surface of a substrate. Preferably, the substrate is transparent to visible light. The substrate can be plastic or a ceramic such as glass. Preferably, the substrate is glass. Most preferable, the substrate is a photovoltaic glass panel. The substrate can have one or two smooth surfaces. The surface can also have one or two patterned surfaces.

The liquid composition can be applied to the surface of the substrate by spraying, dipping, brushing, spinning or any other coating method known to those of skill in the art. Preferably, the liquid composition is sprayed, brushed or spun onto the substrate. Most preferable, the liquid composition is sprayed onto the substrate.

In embodiments, when the liquid composition to applied onto the substrate, the liquid composition and the substrate are at room temperature and the substrate is at atmospheric pressure. In other embodiments, when the liquid composition to applied onto the substrate, the liquid composition and the substrate are at a temperature of 50° C. or above.

When the solid film is heated, the strong acid catalyzes the conversion of a compound comprising Si and O into silica, $SiO_2$. Preferably, the solid film is heated to a temperature in a range of from 500° C. to 800° C., more preferably from 650° C. to 750° C., for a period of time in a range of from 0.5 to 5 minutes, preferably 1 to 3 minutes. During the heating the polyethylene glycol can be burned away, leaving a porous silica film. Increasing the porosity of the silica reduces the index of refraction of the silica.

After heating, the film can be from 700 Å to 2000 μm (e.g., from 700 Å to 2000 Å, or from 700 Å to 1400 Å) thick.

The invention having been generally described, reference is now made to the following examples, which are provided below for purposes of illustration only and are not intended to limit the scope of the invention as defined by the claims.

EXAMPLES

The following examples are intended to be illustrative of the method of the present invention. Other compounds to be used and methods will be recognized and appreciated by those of skill in the art.

Liquid compositions shown in Table 1 below were prepared by mixing together tetraethyl orthosilicate (TEOS), a solution of 30 g polyethylene glycol (PEG) in 100 ml water, a solution of 37 weight % HCl in water, n-butanol, and ethanol. The liquid compositions at room temperature were sprayed in air onto at least one surface of a glass sheet at room temperature, thereby forming a liquid film. The ethanol and n-butanol evaporated from the liquid film, thereby forming a solid film. The solid film was heated to 700° C. for 2 minutes to form a silica film. The anti-reflective coating efficiency, or light transmission of each silica/glass sheet structure compared with the light transmission of an uncoated reference glass sheet, is also reported in Table 1.

TABLE 1

| No. | TEOS (vol %) | PEG | aqHCl | n-butanol (vol %) | PEG/TEOS | Time for complete evaporation of liquid (sec) | Transmission increase (%) |
|---|---|---|---|---|---|---|---|
| 1 | 2 | 2 | 1 | 0 | 1 | 20 | 1 |
| 2 | 2 | 2 | 1 | 1 | 1 | 40 | 1.5 |
| 3 | 2 | 2 | 1 | 2 | 1 | 60 | 2 |
| 4 | 2 | 2 | 1 | 5 | 1 | 90 | 2.5 |
| 5 | 2 | 4 | 1 | 5 | 2 | 90 | 4 |

PEG = vol% of a solution of 30 g polyethylene glycol (Mw = 8000) in 100 ml water; aqHCl = vol% of a solution of 37 weight % HCl in water; The remainder of each liquid composition was ethanol; PEG/TEOS = ratio of the volume % of a solution of 30 g polyethylene glycol in 100 ml water to the volume % of tetraethyl orthosilicate.

Table 1 shows that the increase in light transmission by coating a silica film on a glass sheet is mainly driven by PEG/TEOS (i.e., the ratio of the volume % of a solution of 30 g polyethylene glycol in 100 ml water to the volume % of tetraethyl orthosilicate). A maximum increase in light transmission of 4% was achieved with a PEG/TEOS of 2. A PEG/TEOS of 1 achieved an increase in light transmission no greater than 2.5%.

Table 1 also shows that for a constant PEG/TEOS ration of 1, adding n-butanol to the liquid compositions slowed the evaporation rate of the ethanol and n-butanol liquid from the liquid films and increased the light transmission of the silica/glass sheet structures formed by heating the solid films that remained after the liquid evaporation. When the liquid evaporated in 20, 40, 60 and 90 seconds, the light transmission increase was 1%, 1.5%, 2% and 2.5%, respectively. This shows decreasing the liquid evaporation rate by adding n-butanol resulted in an increase in light transmission.

The anti-reflective films described in the Examples were made from the general method comprising preparing a liquid composition comprising 0.1 to 5 volume % of tetraethyl orthosilicate, 0.231 to 11.5 g of polyethylene glycol per liter of the liquid composition, 0.444 to 8.88 g of HCl per liter of the liquid composition, 0.1 to 20 volume % of n-butanol, and a balance of ethanol; applying the liquid composition onto a surface of a substrate to form a liquid film; evaporating the alcohols from the liquid film to form a solid film; and heating the solid film to form a silica film.

In the Examples, the polyethylene glycol had a weight average molecular weight (Mw) in the range of from 4000 to 16000. Assuming that the 30 g polyethylene glycol in 100 ml water has a density of 1 g/ml, the "0.1 to 5 volume % of a solution of 30 g polyethylene glycol in 100 ml" water is approximately equal to the 0.231 to 11.5 g of polyethylene glycol per liter of the liquid composition.

Assuming that the solution of 37 weight % HCl in water has a density of 1.2 g/ml, the 0.1 to 2 volume % of a solution of 37 weight % HCl in water is approximately equal to the 0.444 to 8.88 g of HCl per liter of the liquid composition. The solution of 37 weight % HCl in water is commercially available hydrochloric acid known as reagent grade.

During the mixing, the ratio (PEG/TEOS) of the volume % of the solution of 30 g polyethylene glycol in 100 ml water to the volume % of tetraethyl orthosilicate can be in a range of from 0.02 to 50. To improve the anti-reflective coating efficiency, the ration of PEG/TEOS is preferably at least 1; more preferably at least 2.

The starting composition in the Examples generally contained 1 to 3 volume % of tetraethyl orthosilicate, 4.6 to 6.9 g of polyethylene glycol per liter of the liquid composition, 1.78 to 2.66 g of HCl per liter of the liquid composition and 1 to 15 volume % of n-butanol.

While the present invention has been described with respect to specific embodiments, it is not confined to the specific details set forth, but includes various changes and modifications that may suggest themselves to those skilled in the art, all falling within the scope of the invention as defined by the following claims.

EMBODIMENTS

1. A method of preparing a coating comprising Si on a substrate, the method comprising:
 (i) preparing a composition comprising a compound comprising Si and O, a polymeric glycol, a strong acid, at least a first alcohol, at least a second alcohol and water;
 (ii) applying the composition onto a surface of a substrate to form a film;
 (iii) evaporating the alcohols from the film; and
 (iv) heating the film;

wherein at least one alcohol has a higher boiling point than at least the other alcohol and is miscible with at least the other alcohol and water.

2. The method according to embodiment 1, wherein preparing the composition comprises mixing together to form a liquid composition:
0.1 to 15 volume % of a compound comprising Si and O;
0.1 to 80 g of a polymeric glycol per liter of composition;
0.1 to 20 g of strong acid per liter of composition;
0.1 to 80 volume % of at least one alcohol having a higher boiling point than at least one other alcohol contained in the composition; and
a balance of the other alcohol contained in the composition.

3. The method according to embodiment 1, wherein preparing the composition comprises mixing together to form a liquid composition:
0.1 to 10 volume % of a compound comprising Si and O;
0.1 to 15 g of a polymeric glycol per liter of composition;
0.1 to 15 g of strong acid per liter of composition;
0.1 to 20 volume % of at least one alcohol having a higher boiling point than at least one other alcohol contained in the composition; and
a balance of the other alcohol contained in the composition.

4. The method according to embodiment 1, wherein preparing the composition comprises mixing together to form a liquid composition:
0.1 to 5 volume % of a compound comprising Si and O;
0.1 to 10 g of a polymeric glycol per liter of composition;
0.1 to 10 g of strong acid per liter of composition;
0.1 to 20 volume % of at least one alcohol having a higher boiling point than at least one other alcohol contained in the composition; and
a balance of the other alcohol contained in the composition.

5. The method according to embodiment 2, wherein during the mixing, a ratio of a volume % of the polymeric glycol per liter of composition to the volume % of the compound comprising Si and O is at least 1.

6. The method according to embodiment 1, wherein the compound comprising Si and O is selected from the group consisting of silanes, silicates, siloxanes and silanols.

7. The method according to embodiment 1, wherein the compound comprising Si and O is tetraethyl orthosilicate.

8. The method according to embodiment 1, wherein the polymeric glycol is selected from the group consisting of polyalkyl glycols and polyalkylene glycols.

9. The method according to embodiment 1, wherein the polymeric glycol is polyethylene glycol.

10. The method according to embodiment 1, wherein the strong acid is selected from the group consisting of nitric acid, hydrochloric acid, sulfuric acid and hydrobromic acid.

11. The method according to embodiment 1, wherein the strong acid is hydrochloric acid.

12. The method according to embodiment 1, wherein the strong acid is nitric acid.

13. The method according to embodiment 1, wherein at least the first alcohol is ethanol.

14. The method according to embodiment 1, wherein the first alcohol is ethanol, and the second alcohol has a boiling point that is higher than the boiling point of ethanol.

15. The method according to embodiment 1, wherein the first alcohol is ethanol, and the second alcohol is selected from the group consisting of propanol, butanol and pentanol.

16. The method according to embodiment 1, wherein the first alcohol is ethanol, and the second alcohol is n-butanol.

17. The method according to embodiment 1, wherein applying the composition comprises dipping, brushing, spinning or spraying the composition onto the surface of the substrate.

18. The method according to embodiment 1, wherein applying the composition comprises spraying the composition onto the substrate.

19. The method according to embodiment 1, wherein the substrate is selected from plastic or glass.

20. The method according to embodiment 19, wherein the substrate is photovoltaic glass having at least one smooth or patterned surface.

21. The method according to embodiment 1, wherein, during the applying, the substrate is at room temperature and atmospheric pressure.

22. The method according to embodiment 1, wherein, during the applying, the liquid composition is at room temperature.

23. The method according to embodiment 1, wherein, during the applying, the substrate is at a temperature of 50° C. or above.

24. The method according to embodiment 1, wherein, during the applying, the liquid composition is at a temperature of 50° C. or above.

25. The method according to embodiment 1, wherein the evaporation of the alcohols takes 60 seconds or more.

26. The method according to embodiment 1, wherein the heating is at a temperature in a range of from 500° C. to 800° C.

27. The method according to embodiment 1, wherein after heating, the film is between 700 and 1400 Å thick.

28. The method according to embodiment 1, wherein after heating, the film is porous.

29. A method of increasing the transmission of light through a substrate, the method comprising:
(i) preparing a composition comprising a compound comprising Si and O, a polymeric glycol, a strong acid, at least two alcohols and water;
(ii) applying the composition onto a surface of a substrate to form a film on the substrate;
(iii) evaporating the alcohols from the film; and
(iv) heating the film;
wherein at least one alcohol has a higher boiling point than the other and is miscible with both the other alcohol and water; and wherein, after heating, the transmission of light through the substrate comprising said film is increased by at least 0.5% when compared to the transmission of light through the substrate not comprising said film.

30. A method of making a coating comprising Si on a substrate, the method comprising:
(i) preparing a composition comprising tetraethyl orthosilicate, polyethylene glycol, HCl, ethanol, at least one alcohol having a higher boiling point than ethanol, and water;
(ii) applying the composition onto a surface of a substrate to form a film;
(iii) evaporating the at least one alcohol and the ethanol from the film; and
(iv) heating the film;
wherein the at least one alcohol having a higher boiling point than ethanol is miscible with both ethanol and water.

31. The method according to embodiment 30, wherein preparing the composition comprises mixing together to form a liquid composition:
0.1 to 10 volume % of tetraethyl orthosilicate,
0.1 to 20 volume % of a solution of 30 g polyethylene glycol in 100 ml water, 0.1 to 2 volume % of a solution of 37 weight % HCl in water,
0.1 to 80 volume % of at least one alcohol having a higher boiling point than ethanol, and
a balance of ethanol.

32. The method according to embodiment 31, wherein during the mixing, a ratio of the volume % of the solution of 30 g polyethylene glycol in 100 ml water to the volume % of tetraethyl orthosilicate is at least 0.5.

33. The method according to embodiment 30, wherein the at least one alcohol comprises a monohydric alcohol.

34. The method according to embodiment 30, wherein the at least one alcohol comprises n-butanol.

35. The method according to embodiment 30, wherein the composition comprises 1 to 3 volume % of tetraethyl orthosilicate.

36. The method according to embodiment 30, wherein the composition comprises 4.6 to 6.9 g of polyethylene glycol per liter of the composition.

37. The method according to embodiment 30, wherein the composition comprises 1.78 to 2.66 g of HCl per liter of the composition.

38. The method according to embodiment 30, wherein the composition comprises 1 to 20 volume % of the at least one alcohol having a higher boiling point than ethanol.

39. The method according to embodiment 30, wherein the substrate is selected from the group consisting of plastic and glass.

40. The method according to embodiment 30, wherein the substrate is photovoltaic glass having at least one smooth or patterned surface.

41. The method according to embodiment 30, wherein, during the applying, the substrate is at room temperature and atmospheric pressure.

42. The method according to embodiment 30, wherein, during the applying, the liquid composition is at room temperature.

43. The method according to embodiment 30, wherein, during the applying, the substrate is at a temperature of 50° C. or above.

44. The method according to embodiment 30, wherein, during the applying, the liquid composition is at a temperature of 50° C. or above.

45. The method according to embodiment 30, wherein the applying comprises spraying the composition onto the surface of the substrate.

46. The method according to embodiment 30, wherein the evaporation of the at least one alcohol and the ethanol takes 60 seconds or more.

47. The method according to embodiment 30, wherein the heating is at a temperature in a range of from 500° C. to 800° C.

48. The method according to embodiment 30, wherein after heating, the film is between 700 Å and 2000 μm thick.

49. The method according to embodiment 30, wherein after heating, the film is porous.

50. A method of making an anti-reflective coating, the method comprising preparing a liquid composition comprising
0.1 to 5 volume % of tetraethyl orthosilicate,
0.231 to 20 g of polyethylene glycol per liter of the liquid composition,
0.444 to 8.88 g of HCl per liter of the liquid composition,
0.1 to 20 volume % of at least one alcohol having a higher boiling point than ethanol and miscibility with both ethanol and water, and
a balance of ethanol;
applying the liquid composition onto a surface of a substrate to form a liquid film;
evaporating the at least one alcohol and the ethanol from the liquid film to form a solid film; and
heating the solid film to form a silica film.

51. The method according to embodiment 50, wherein the liquid composition is prepared by mixing together
0.1 to 5 volume % of tetraethyl orthosilicate,
0.1 to 5 volume % of a solution of 30 g polyethylene glycol in 100 ml water,
0.1 to 2 volume % of a solution of 37 weight % HCl in water,
0.1 to 20 volume % of at least one alcohol having a higher boiling point than ethanol and miscibility with both ethanol and water, and
a balance of ethanol.

52. The method according to embodiment 51, wherein during the mixing a ratio of the volume % of the solution of 30 g polyethylene glycol in 100 ml water to the volume % of tetraethyl orthosilicate is at least 0.5.

53. The method according to embodiment 50, wherein the at least one alcohol comprises a monohydric alcohol.

54. The method according to embodiment 50, wherein the at least one alcohol comprises n-butanol.

55. The method according to embodiment 50, wherein the liquid composition comprises 1 to 3 volume % of tetraethyl orthosilicate.

56. The method according to embodiment 50, wherein the liquid composition comprises 4.6 to 6.9 g of polyethylene glycol per liter of the liquid composition.

57. The method according to embodiment 50, wherein the liquid composition comprises 1.78 to 2.66 g of HCl per liter of the liquid composition.

58. The method according to embodiment 50, wherein the liquid composition comprises 1 to 20 volume % of the at least one alcohol having a higher boiling point than ethanol and miscibility with both ethanol and water.

59. The method according to embodiment 50, wherein the substrate is selected from the group consisting of plastic and glass.

60. The method according to embodiment 50, wherein the substrate is photovoltaic glass having at least one smooth or patterned surface.

61. The method according to embodiment 50, wherein during the applying the substrate is at room temperature and atmospheric pressure.

62. The method according to embodiment 50, wherein during the applying the liquid composition is at room temperature.

63. The method according to embodiment 50, wherein during the applying the substrate is at a temperature of 50° C. or above.

64. The method according to embodiment 50, wherein during the applying the liquid composition is at a temperature of 50° C. or above.

65. The method according to embodiment 50, wherein the applying comprises spraying the liquid composition onto the surface of the substrate.

66. The method according to embodiment 50, wherein the evaporation of the at least one alcohol and the ethanol from the liquid film to form the solid film takes 60 seconds or more.

67. The method according to embodiment 50, wherein the heating is at a temperature in a range of from 500° C. to 800° C.

68. The method according to embodiment 50, wherein the silica film is between 700 Å and 2000 μm thick.

69. The method according to embodiment 50, wherein the silica film is porous.

70. A coating on a substrate made by the method of embodiment 1.

71. A coating on a substrate made by the method of embodiment 29.

72. A coating on a substrate made by the method of embodiment 30.

73. A coating on a substrate made by the method of embodiment 50.

What is claimed is:

1. A method reducing reflectiveness of a substrate, the method comprising:
   (i) preparing a composition comprising a compound comprising Si and O, a polymeric glycol, a strong acid, ethanol, n-butanol, and water;
   (ii) applying the composition onto a surface of a substrate in need thereof, thereby forming a film of said composition;
   (iii) evaporating the alcohols from the film to solidify the film; and
   (iv) heating the solidified film to a temperature of from 500 to 800° C., thereby forming a coating comprising Si on the substrate;
   wherein n-butanol is miscible with ethanol and water,
   during the preparing, a ratio of a volume % of a solution of 30 g polymeric glycol in 100 ml water to a volume % of the compound comprising Si and O is at least 1, and
   the composition comprises from 0.1 to 15 volume % of the compound comprising Si and O, from 0.1 to 80 g of the polymeric glycol per liter of composition, from 0.1 to 20 g of the strong acid per liter of composition, and from 0.1 to 5 volume % of n-butanol.

2. The method according to claim 1, wherein after heating, the film is between 700 Å and 2000 μm thick.

3. The method according to claim 1, wherein after heating, the film is porous.

4. The method according to claim 1, wherein the composition is prepared by mixing together
   0.1 to 5 volume % of tetraethyl orthosilicate, present as said compound comprising Si and O,
   0.1 to 5 volume % of a solution of 30 g polyethylene glycol in 100 ml water,
   0.1 to 2 volume % of a solution of 37 weight % HCl in water,
   0.1 to 0.5 volume % of n-butanol, and
   a balance of ethanol.

5. The method according to claim 4, wherein the composition comprises 1 to 3 volume % of tetraethyl orthosilicate.

6. The method according to claim 4, wherein the composition comprises 4.6 to 6.9 g of polyethylene glycol per liter of the liquid composition.

7. The method according to claim 4, wherein the composition comprises 1.78 to 2.66 g of HCl per liter of the liquid composition.

8. The method according to claim 1, wherein the substrate is selected from the group consisting of plastic and glass.

9. The method according to claim 1, wherein the substrate is photovoltaic glass having at least one smooth or patterned surface.

10. The method according to claim 1, wherein during the applying the substrate is at room temperature and atmospheric pressure.

11. The method according to claim 1, wherein during the applying the composition is at room temperature.

12. The method according to claim 1, wherein during the applying the substrate is at a temperature of 50° C. or above.

13. The method according to claim 1, wherein during the applying the composition is at a temperature of 50° C. or above.

14. The method according to claim 1, wherein the applying comprises spraying the composition onto the surface of the substrate.

15. The method according to claim 1, wherein the film is a silica film and is between 700 Å and 2000 μm thick.

16. The method according to claim 2, wherein the film is a silica film and is porous.

17. The method according to claim 1, wherein said compound comprising Si and O comprises at least one member selected from the group consisting of a silicate, a silanol, a siloxane, and a silane.

* * * * *